US010097197B1

(12) United States Patent  
Robinson et al.

(10) Patent No.: US 10,097,197 B1  
(45) Date of Patent: Oct. 9, 2018

(54) DIGITAL ANALOG DITHER ADJUSTMENT

(71) Applicant: Raytheon Company, Waltham, MA (US)

(72) Inventors: Ian S. Robinson, Waltham, MA (US); Daniel Thompson, Waltham, MA (US); James Toplicar, Waltham, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/722,265

(22) Filed: Oct. 2, 2017

(51) Int. Cl.
*H03M 1/20* (2006.01)
*G02B 6/35* (2006.01)
*H03M 1/66* (2006.01)
*H03M 1/60* (2006.01)

(52) U.S. Cl.
CPC .......... *H03M 1/201* (2013.01); *G02B 6/3588* (2013.01); *H03M 1/60* (2013.01); *H03M 1/66* (2013.01)

(58) Field of Classification Search
CPC .......... H03M 1/201; H03M 1/60; H03M 1/66; H03M 1/0639; H03M 1/0649; G02B 6/3588
USPC .................................................. 341/131, 155
See application file for complete search history.

(56) References Cited

U.S. PATENT DOCUMENTS 5,493,298 A 2/1996 Bartz
6,433,723 B1 * 8/2002 Randall ............... H03M 1/0641
                                                            341/131
7,277,033 B1 10/2007 Kriz
9,503,120 B1 * 11/2016 Tan ........................ H03M 3/30

OTHER PUBLICATIONS

Glascott-Jones, "Dither Can Boost Sampled Data System Performance by at Least 10 dB," source URL: http://www.electronicdesign.com/analog/dither-can-boost-sampled-data-system-performance-by-at-least-10-db, Jan. 25, 2013.
Melkonian, "Improving A/D Converter Performance Using Dither," National Semiconductor Corporation, Application Note 804; Texas Instruments, Literature No. SNOA232; 10 pages; Feb. 1992.
Plisch, "Maximizing SFDR Performance in the GSPS ADC: Spur Sources and Methods of Mitigation," Texas Instruments, Application Report SLAA617; 20 pages; Dec. 2013.
Wannamaker, "The Theory of Dithered Quantization," a thesis presented to the University of Waterloo; Waterloo, Ontario, Canada; 223 pages; 2003.
"Dithering in Analog-to-digital Conversion," e2v Semiconductors SAS; 0869B-BDC-06/07; 12 pages; Jun. 2007.
Carbone, et al., "Performance of Stochastic and Deterministic Dithered Quantizers," IEEE Transactions on Instrumentation and Measurement; vol. 49, No. 2; 4 pages; Apr. 2000.

* cited by examiner

*Primary Examiner* — Khai M Nguyen
(74) *Attorney, Agent, or Firm* — Burns & Levinson, LLP; Joseph M. Maraia

(57) ABSTRACT

A method and system for data conversion includes an analog noise generator to generate a random, non-deterministic, analog noise signal. An adder adds the analog noise signal to an analog RF signal to produce a dithered analog signal. A first quantizer converts the analog noise signal to digital to produce a digital noise signal. A second quantizer converts the dithered analog signal to a digital equivalent signal. A digital dither adjustment module removes amplitude measurements of the digital noise signal from the digital equivalent signal to obtain a linearized digital representation of the analog RF signal.

20 Claims, 4 Drawing Sheets

DIGITAL ANALOG DITHER ADJUSTMENT

TECHNICAL FIELD

The present disclosure relates generally to the analog-to-digital conversion, and more specifically, to linearization through dithering.

BACKGROUND

High performance analog-to-digital converters (ADCs) are now widely used in many applications, including RF receivers (e.g., radar) and electronic countermeasures, communication systems, test instrumentation and others, that handle large dynamic ranges of signal amplitudes of a high data rate signals. Ideal ADCs have equally spaced levels of voltage references against which the input signal is compared. Ideal ADCs transfer energy from the frequencies of the input signal or signals to other frequencies as a result of the inherent non-linearity of their transfer function. The transferred energy is often referred to as spurs, as they show up as spikes in a spectrogram of the device output when the input is a tone. Most ADCs suffer additional non-linearities. One particular problem in such high performance ADCs is differential non-linearity (DNL) errors. DNL error is generally defined as the difference between an actual transfer function step width of an ADC and the ideal value of 1 least significant bit (LSB), and is often due to mismatches in the ADC's resistance ladder providing threshold reference voltages and its comparator circuits. Spurs can cause a significant degradation for some systems, especially where a large signal is present and the system must reliably detect much smaller signals at the same time. The spurs or distortion can cause false detections or cause missed detections. The electronics industry is constantly striving to improve the spurious free dynamic range (SFDR) of ADCs. A receiver with excellent SFDR is able to detect small signals in the presence of much larger ones. Non-linearities, for example DNL errors, effectively decrease a receiver's SFDR rating.

A well-known technique called dithering is often required to maximize SFDR. Dithering is the process of adding an uncorrelated signal, such as pseudo random noise (PRN) or broadband noise, to a desired analog signal prior to the analog input gate of the ADC. A common approach to creating dither is to use a noise or thermal diode whose output is summed with the wanted signal prior to digitization. Although the injected dither does not eliminate the errors, it whitens the resulting errors, spreading the spurs across a wideband of frequencies with much less power at any frequency. Without dither an input signal constantly is quantized at a particular portion of the dynamic range with some given DNL errors of the ADC, thereby repetitively providing the same error. The repetition forces the spurious signals to be at a set of frequencies and amplitudes for a given input. Adding dither to the input results in the combined signal being converted across a wider set of reference voltages interacting with different ones as the dither varies, even when the wanted inputs signal has a constant waveform. Adding dither improves the resolution and linearity of the conversion by effectively smoothing the quantization errors of the ADC's transfer function. However, while spurs are reduced, a commensurate increase in the noise floor occurs as adding the dither is equivalent to adding noise to the wanted signal. Many conventional systems simply accept degradation of the noise floor to improve SFDR or they sub-optimize SFDR to avoid the additional noise. FIG. 1A illustrates a prior art embodiment of a SFDR maximization, wherein a digital PRN generator 10 generates a random digital signal that is converted to an analog dither signal by a high dynamic range digital-to-analog converter (DAC) 12 coupled to a summer 14, which adds the analog dither signal to an analog input signal 14 before the dithered analog signal is digitized by ADC 16. The "known" random digital signal is subtracted from the converter response at digital subtractor 18. This is a more expensive process for dither creation than a simple diode and will not be 100% random. Further, if a system has multiple ADCs whose results are to be combined (e.g. a phased array radar), where each ADC requires dither then the dither source must produce random dither for each ADC that is further uncorrelated with the all the other dithers created. To be random for one ADC and uncorrelated to many dither sources is a challenge to a PRN generator. There is interest in putting an ADC at each element of a phased array (enabling element level digital beamforming) but it is difficult if not impractical to provide random dither to each ADC that is not correlated with any of the other dither digitally created for other ADCs.

FIG. 1B shows another common technique for spur reduction, wherein a wideband non-correlated signal is generated using a thermal noise source 20, and then added to the analog input signal by a summer 14. Depending upon on how much noise must be injected, signal-to-noise ratio (SNR) of the ADC 16 may be unduly sacrificed.

SUMMARY

The present disclosure describes embodiments of improved systems and methods for linearizing quantization of an RF signal. In one embodiment, a data conversion system is provided, including an analog noise generator operational to generate a random, non-deterministic, analog noise signal, an adder circuit operational to add the analog noise signal to a wanted analog RF signal to produce a dithered analog signal, and a first quantizer operational to convert the dithered analog signal to a digital equivalent signal. The data conversion system also includes a second quantizer coupled to the analog noise generator and operational to convert in parallel the analog noise signal to a digital noise signal, and an adjustment (e.g., subtraction) circuit coupled to the outputs of the first and second quantizers and operational to remove and/or subtract amplitude measurements of the digital noise signal from the digital output of the first quantizer to obtain a linearized digital representation of the analog RF signal.

In one embodiment, the analog noise generator may comprise a thermal noise diode. The analog noise generator may alternatively generate analog noise whose amplitude has a uniform distribution. In either of these cases many such noise generators may supply the respective ADCs of a phased array or other system where ADC outputs will be summed and the dither provided to the respective ADCs will be uncorrelated.

In another aspect, the second quantizer has a lower bit resolution than the first quantizer. The second quantizer may have a bit resolution of four or fewer.

In one example, the data conversion system may also include a frequency conversion circuit configured with a local oscillator operational to frequency convert a signal received from an antenna to obtain the analog RF signal.

In another example, the data conversion system may also include gain control circuity for controlling the gain of the system, such that the analog noise signal contained within the dithered analog signal toggles among least significant bits (LSBs) of the first quantizer.

The analog noise signal may be less than or equal to 1/10th the power of the desired RF input signal, and may be less than the most significant bit (MSB) of the first quantizer. The data conversion system may include amplifying circuitry adapted to amplify the analog noise signal prior to measurement by the second quantizer.

The first quantizer may comprise a step-wise linear quantizer, or a non-uniform quantizer having larger quantization errors at its higher most significant bits.

In another aspect, embodiments of the present disclosure provide a method for linearizing a quantizer, including the steps of generating with the analog noise generator the random, non-deterministic, analog noise signal, adding the noise signal to the analog RF signal to produce the dithered analog signal, converting the dithered analog signal to the digital equivalent signal with the first quantizer, converting in parallel the analog noise signal to the digital noise signal with the second quantizer, and removing and/or subtracting measured amplitudes of the digital noise signal from the digital equivalent signal to obtain the linearized digital representation of the analog RF signal.

Variations of the method in accordance with the system embodiments described above are also provided by the present disclosure.

The foregoing and other features and advantages of the embodiments will be apparent from the following more particular description, as illustrated in the accompanying drawing.

BRIEF DESCRIPTION OF THE FIGURES

The present disclosure is further described in the detailed description which follows, in reference to the noted plurality of drawings by way of non-limiting examples of embodiments of the present disclosure, in which like reference numerals represent similar parts throughout the several views of the drawings.

DETAILED DESCRIPTION

The details described and illustrated herein are by way of example and for purposes of illustrative description of the exemplary embodiments only and are presented in the case of providing what is believed to be the most useful and readily understood description of the principles and conceptual aspects of the disclosure. In this regard, no attempt is made to show structural details of the subject matter in more detail than is necessary for the fundamental understanding of the disclosure, the description taken with the drawings making apparent to those skilled in that how the several forms of the present disclosure may be embodied in practice with additional components or steps and/or without all of the components or steps that are described. Further, like reference numbers and designations in the various drawings indicate like elements.

Figure 1A:
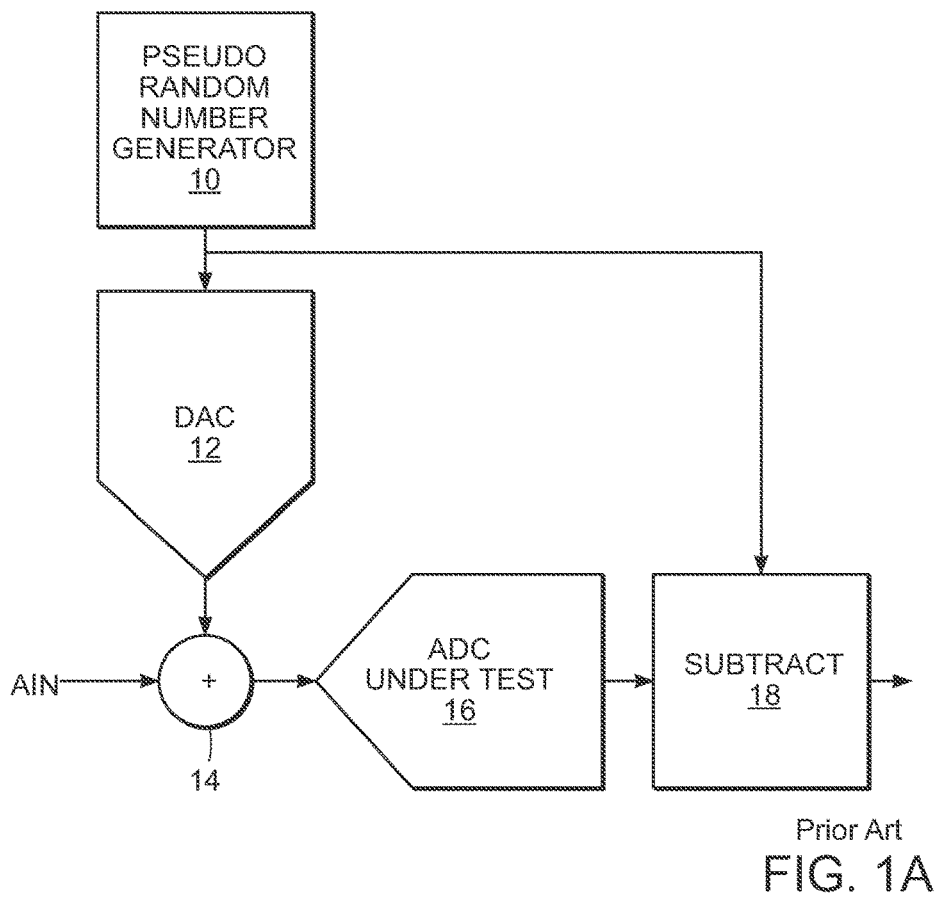
FIGS. 1A and 1B are schematic circuit diagrams of example prior art embodiments of dithered analog to digital conversion systems.
Figure 1B:
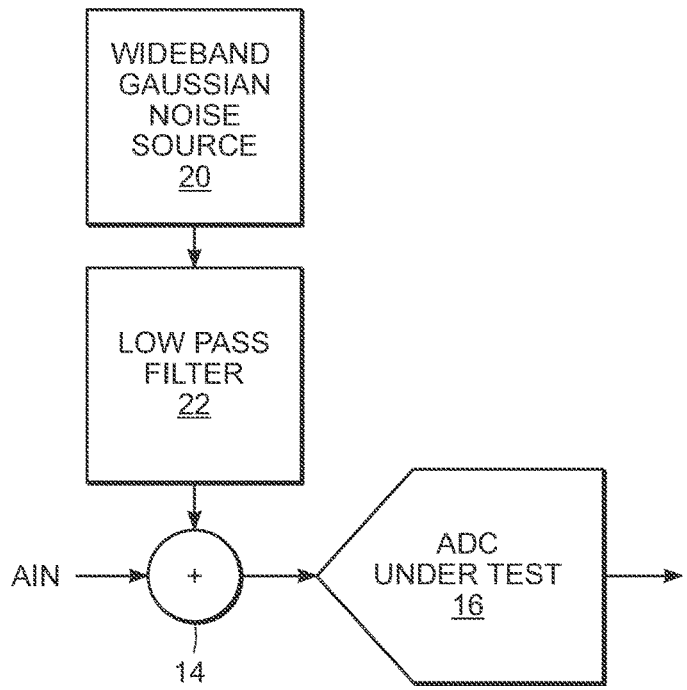
Figure 2:
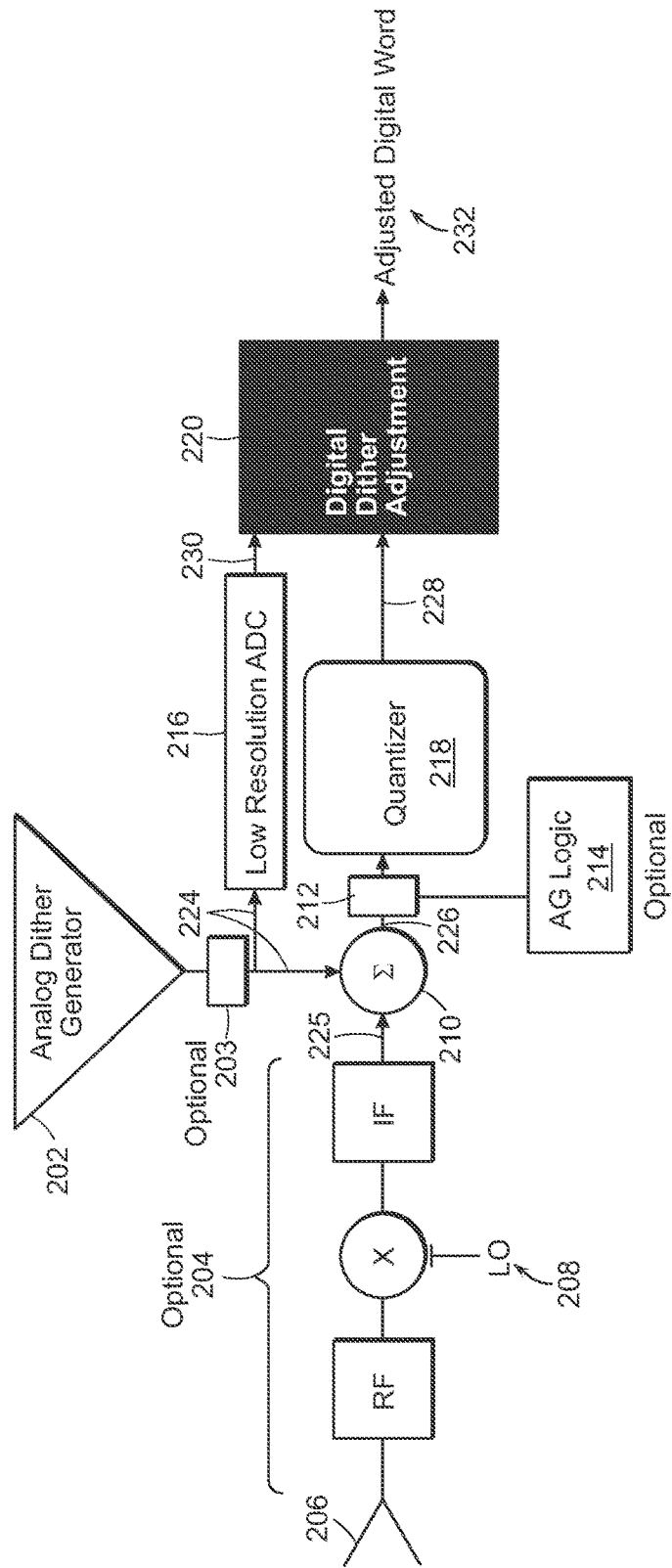
FIG. 2 is a schematic circuit diagram of an exemplary analog to digital conversion system in accordance with an embodiment of the disclosure.

FIG. 2 shows a schematic diagram of a data conversion system 200 in accordance with an exemplary embodiment of the present disclosure. System 200 provides dither to be summed with a signal being digitized in order to linearize (i.e., reduce the size and number of spurs of) the quantization in a manner that removes the noise from the final output that occurs in other dither systems. This implementation is less costly to achieve randomness and decorrelation with other dither sources than conventional dithered quantization. The addition of dither to the intended signal prior to digitization, in essence, spreads the effect of the signal's interaction with the quantization measurement system, reducing the measurement system's imperfections. As illustrated, system 200 includes an analog dither generator 202 and optional front end circuitry 204, which includes an antenna 206 and a frequency conversion circuit having a local oscillator 208. System 200 also includes an adder circuit 210, optional gain control circuitry including an amplifier circuit 212 and gain control logic 214, a low-resolution ADC (i.e., a first quantizer) 216, a second quantizer 218, and a digital dither adjustment module 220. Likewise, the embodiment illustrated may employ a method of improving the dynamic range of a quantizer employing dither in accordance with the disclosure.

The analog dither generator 202 generates a random, non-deterministic, analog noise signal. In one embodiment, the analog dither generator 202 may comprise a low-cost thermal noise diode. The quantum mechanical nature of electron-hole pairing process within such devices produces a truly random noise signal with very high bandwidth. In a preferred embodiment, the analog dither generator 202 comprises a uniform analog noise generator. The dither signal is preferably uncorrelated in time, uncorrelated with the desired RF analog input signal, and has "white noise" properties. The probability distribution of amplitudes should be as close to either Gaussian or uniform as practical. The level of the applied dither signal should be commensurate with the level of nonlinearity expected from the ADC. Since noise power levels out of such electronic components are quite small, noise gain control circuitry 203 may be necessary (as might be frequency filtering circuitry, not shown). The gain control circuitry 203 may control the gain such that the analog dither signal 224 within the dithered analog signal 226 toggles among LSBs of second quantizer 218. Thermal noise at the level of 1 LSB will remove the periodicity of the quantization error. If gain control is not necessary, fixed gain blocks (e.g., low cost operational amplifiers) may be utilized. An analog dither signal 224 output by the analog dither generator 202 is provided as inputs to the adder circuit 210 and the low-resolution first quantizer 216. The low-resolution first quantizer 216 can be a low cost ADC with few bits, and/or a non-uniform quantizer and/or a step-wise linear quantizer. These options will typically provide a sufficient estimate of the dither for the purposes of correction, as the residual dither after correction will no longer be larger than the other system noises.

Adder 210 receives the analog dither signal 224 and an analog RF signal 225 from optional front end circuity 204, which may comprise an RF signal received at antenna 206 and down-converted by local oscillator 208 into an RF intermediate frequency IF. In most cases, the analog dither signal 224 has a power less than or equal to 1/10th the power of the analog RF signal 225, and has a maximum amplitude less than the MSB of second quantizer 218. For multi-bit quantizers, the dither level is normally well below the MSB of second quantizer 218, so the dither voltage or current is a noise terms that is root sum squared with other noise voltages to obtain the total noise level of the digitized signal. Adder 210 combines the input analog dither signal 224 and analog RF signal 225 to form a dithered analog signal 226. The dithered analog signal 226 may optionally be gain-adjusted by logarithmic amplifying circuitry 212 and gain control logic 214 prior to being input into the second quantizer 218.

Second quantizer 218 may comprise a step-wise linear quantizer of any number of bits, a non-uniform quantizer having larger quantization errors at its higher MSBs, or the like, and be configured conventionally with a plurality of comparators (not shown) arranged in a parallel configuration for comparing a corresponding plurality of threshold reference voltages (e.g., produced by a resistor ladder) against the input dithered analog signal 226. Second quantizer 218 outputs digital equivalent signals 228 representative of the comparison of dithered analog signal 226 and the threshold reference voltages, which are received as an input by digital dither adjustment module 220.

In parallel to the quantization of the dithered analog signal by second quantizer 218, low resolution ADC (i.e. first quantizer) 216 receives as input analog dither signal 224 and outputs an equivalent digital noise signal 230 as an input to digital dither adjustment module 220. First quantizer 216, which may comprise a low-cost, low-resolution ADC, has a lower bit resolution than second quantizer 218, such a bit resolution of four bits or fewer. Ideally, error in the dither signal quantization is smaller than other system noises. A 3-bit ADC has approximately a 3.6% 1-sigma voltage error (uncorrected residual dither), whereas 4-bit and 2-bit ADCs have, respectively, about 1.8% and 7.2% residual errors. Thus, if the analog dither signal 224 has a standard deviation of about 4 LSBs of second quantizer 218, then even a 2-bit ADC may be used for first quantizer 216 with significant improvement in dynamic range over prior conversion systems. System gain may be set such that quantization noise is much smaller than other system noise, correcting residual dither to be much smaller than a LSB. It is desirable to know with precision when the analog dither signal is large compared to other system noise, and to correct that signal to the extent possible. As previously noted, an option for accomplishing this may be to employ logarithmic amplification prior to conversion, or use a non-uniform quantizer.

In one embodiment, digital dither adjustment module 220 removes the digital noise signal 230 from the collection of digital equivalent samples 228 to obtain a linearized digital representation 232 (i.e., a digital word) of the desired RF input signal 225. The removal of the digital noise signal 230 beneficially increases the effective dynamic range of conversion process reducing spurious tones without the conventional trade-off of elevating the noise floor, which reduces dynamic range, of second quantizer 218. In some cases, the removal of the digital noise signal 230 is accomplished by subtraction of amplitude measurements of the digital noise signal 230 from the digital equivalent signal 228 to obtain a linearized digital representation of the analog RF signal 225. In other cases, such as when logarithmic amplification is applied prior to conversion of the noise signal 224 to digital, removal of the digital noise signal 230 will include compensating for the logarithmic compression before the digital noise signal 230 is subtracted, or otherwise removed. The ability to nearly completely cancel the added noise is important. A slight mismatch between the added and subtracted noise results in an incomplete cancellation. The larger the added noise, the worse the effect of this incomplete cancellation. This is one of the main reasons for prior systems limiting the amount of added noise.

Experimental Results

Figure 3A:
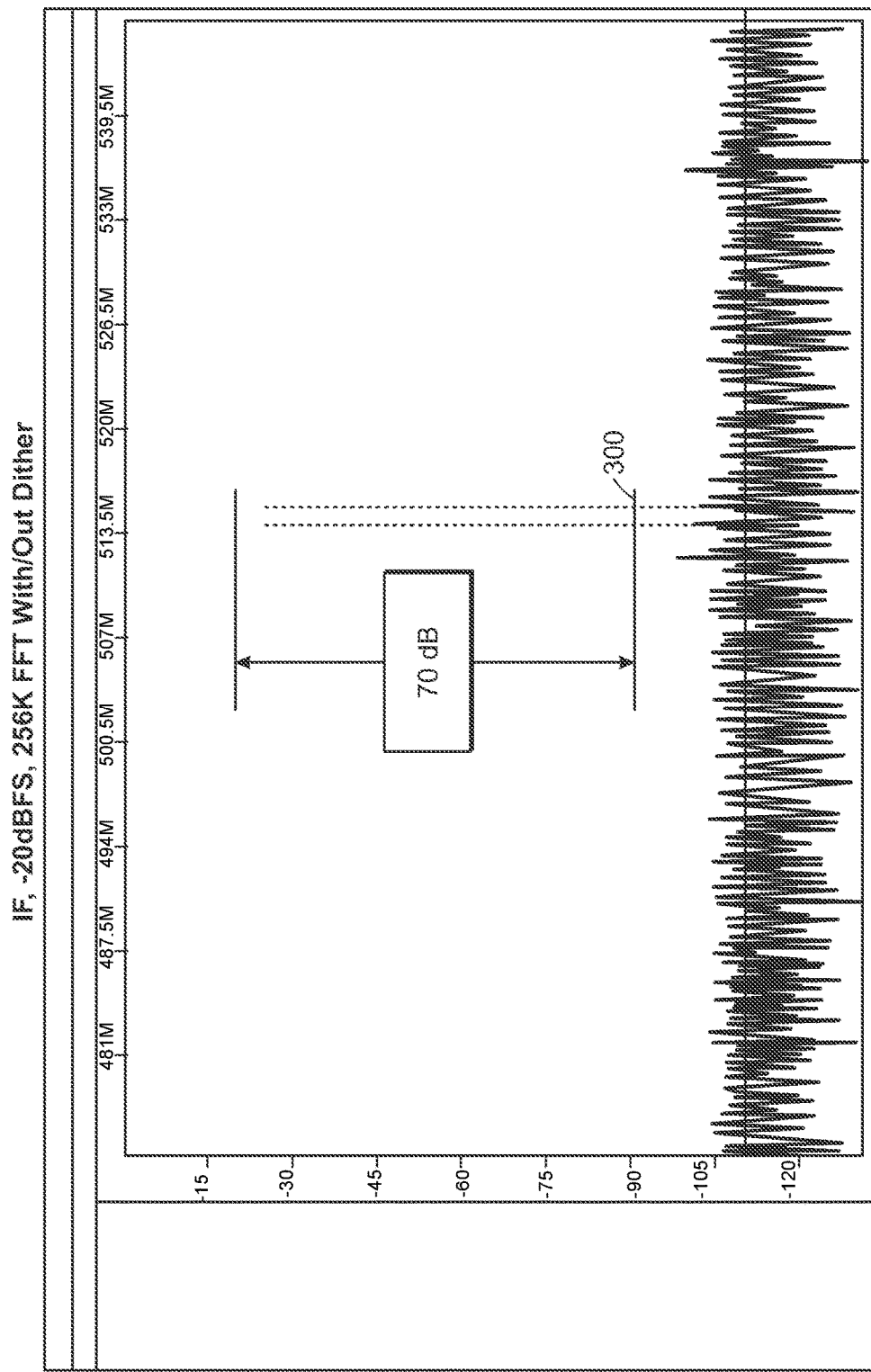
FIGS. 3A and 3B are plots of comparative test results without dither and with dither, respectively, in accordance with an embodiment of the disclosure.
Figure 3B:
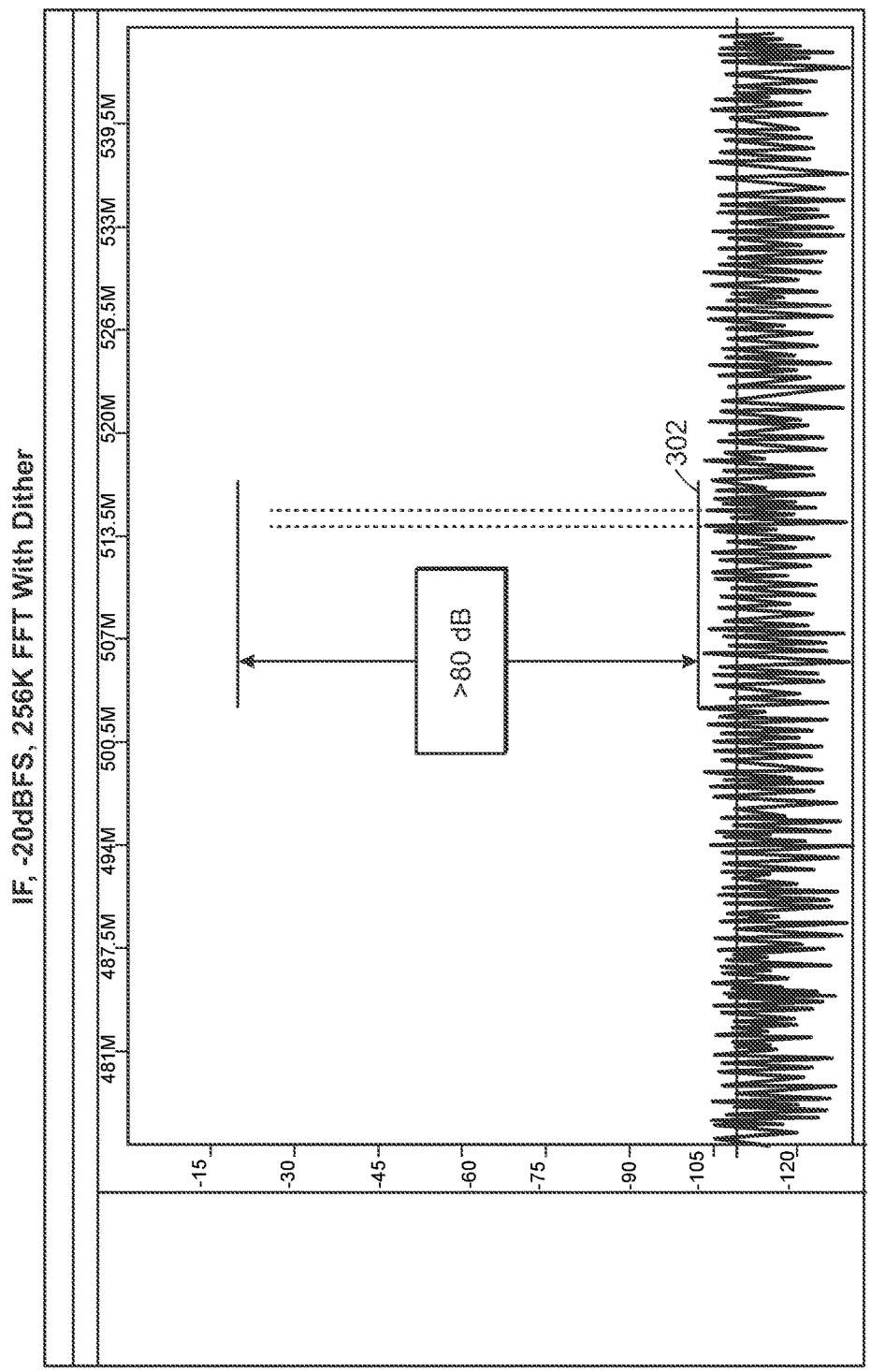

In the comparative results shown in FIGS. 3A and 3B, a high-speed ADC (such as second quantizer 218) was operated without dithering (FIG. 3A) and then, in accordance with an embodiment of this disclosure, with a low-resolution digital noise signal 230 (produced by a low-resolution ADC, such as first quantizer 216) subtracted from the digital equivalent 228 of a high power dither analog signal output by the second quantizer 218 (FIG. 3B). The outputs of the second quantizer 218 were analyzed using a 256-point FFT. The spurs are reduced by about 10 dB using dither of $\frac{1}{10}^{th}$ full scale power. Such dither would normally increase the overall noise floor about 2 dB. Digital subtraction removed the vast majority (~99%) noise floor increase, reducing it to about a 1% increase. For purposes of further comparison, if the analog dither noise voltage is about 170% of other system noises, conventional conversion systems experience about a 3 dB degradation. However, use of a 3-bit dither quantizer and the disclosed digital subtraction technique reduces residual degradation to less than 0.1 dB (a 2-bit ADC results in ~0.25 dB). This represents a significant improvement in spur-free dynamic range. When considering the effective DNL of a dithered ADC, the DNL errors can in a practical sense approach near perfect performance. This effectively maximizes the SNR based only on jitter, thermal noise and quantization levels. DNL errors make practically no contribution to overall SNR (or SFDR) as seen in FIG. 3B.

Various embodiments of the above-described systems and methods may be implemented in digital electronic circuitry, in computer hardware, firmware, and/or software. The implementation can be as a computer program product (i.e., a computer program tangibly embodied in an information carrier). The implementation can, for example, be in a machine-readable storage device and/or in a propagated signal, for execution by, or to control the operation of, data processing apparatus. The implementation can, for example, be a programmable processor, a computer, and/or multiple computers.

A computer program can be written in any form of programming language, including compiled and/or interpreted languages, and the computer program can be deployed in any form, including as a stand-alone program or as a subroutine, element, and/or other unit suitable for use in a computing environment. A computer program can be deployed to be executed on one computer or on multiple computers at one site.

Method steps can be performed by one or more programmable processors and/or controllers executing a computer program to perform functions of the invention by operating on input data and generating output. Method steps can also be performed by, and an apparatus can be implemented as, special purpose logic circuitry. The circuitry can, for example, be a FPGA (field programmable gate array) and/or an ASIC (application-specific integrated circuit). Modules, subroutines, and software agents can refer to portions of the computer program, the processor, the special circuitry, software, and/or hardware, e.g., a controller such as a microcontroller, which implements that functionality.

Processors suitable for the execution of a computer program include, by way of example, both general and special purpose microprocessors, and any one or more processors of any kind of digital computer. Generally, a processor receives instructions and data from a read-only memory or a random access memory or both. The essential elements of a computer are a processor for executing instructions and one or more memory devices for storing instructions and data.

Generally, a computer can be operatively coupled to receive data from and/or transfer data to one or more mass storage devices for storing data, e.g., magnetic, magneto-optical disks, or optical disks.

Whereas many alterations and modifications of the disclosure will no doubt become apparent to a person of ordinary skill in the art after having read the foregoing description, it is to be understood that the particular embodiments shown and described by way of illustration are in no way intended to be considered limiting. Further, the subject matter has been described with reference to particular embodiments, but variations within the spirit and scope of the disclosure will occur to those skilled in the art. It is noted that the foregoing examples have been provided merely for the purpose of explanation and are in no way to be construed as limiting of the present disclosure.

What is claimed is:

1. A data conversion system, comprising:
    an analog noise generator adapted to generate a random, non-deterministic, analog noise signal;
    an adder adapted to add the analog noise signal to an analog RF signal to produce a dithered analog signal;
    a first quantizer adapted to convert the analog noise signal to digital to produce a digital noise signal;
    a second quantizer adapted to convert the dithered analog signal to a digital equivalent signal; and
    a digital dither adjustment module adapted to remove amplitude measurements of the digital noise signal from the digital equivalent signal to obtain a linearized digital representation of the analog RF signal.

2. The data conversion system of claim 1, wherein the analog noise generator comprises a thermal noise diode.

3. The data conversion system of claim 1, wherein the analog noise generator comprises a uniform analog noise generator.

4. The data conversion system of claim 1, wherein the first quantizer has a lower bit resolution than the second quantizer.

5. The data conversion system of claim 1, wherein the first quantizer has a bit resolution of four or fewer.

6. The data conversion system of claim 1, further comprising a frequency conversion circuit that includes a local oscillator adapted to frequency convert a signal received from an antenna to obtain the analog RF signal.

7. The data conversion system of claim 1, further comprising gain control circuity for controlling the gain of the system such that the analog noise signal contained within the dithered analog signal toggles among least significant bits of the second quantizer.

8. The data conversion system of claim 1, wherein the digital dither adjustment module is further adapted to remove the amplitude measurements of the digital noise signal from the digital equivalent signal by subtracting the amplitude measurements from the digital noise signal.

9. The data conversion system of claim 1, further comprising logarithmic amplifying circuitry adapted to amplify the analog noise signal prior to conversion by the first quantizer.

10. The data conversion system of claim 1, wherein the first quantizer comprises a step-wise linear quantizer or a non-uniform quantizer having larger quantization errors at its higher most significant bits.

11. A method of linearizing a quantizer, comprising:
    generating with an analog noise generator a random, non-deterministic, analog noise signal;
    adding the noise signal to an analog RF signal to produce a dithered analog signal;
    converting the analog noise signal to a digital noise signal with a first quantizer;
    converting the dithered analog signal to a digital equivalent signal with a second quantizer; and
    removing measured amplitudes of the digital noise signal from the digital equivalent signal to obtain a linearized digital representation of the analog RF signal.

12. The method of claim 11, wherein the analog noise generator comprises a thermal noise diode.

13. The method of claim 11, wherein the analog noise generator comprises a uniform analog noise generator.

14. The method of claim 11, wherein the first quantizer has a lower bit resolution than the second quantizer.

15. The method of claim 11, wherein the first quantizer has a bit resolution of four or fewer.

16. The method of claim 11, further comprising a frequency conversion circuit that includes a local oscillator operational to frequency convert a signal received from an antenna to obtain the analog RF signal.

17. The method of claim 11, further comprising controlling the gain of the system such that the analog noise signal contained within the dithered analog signal toggles among least significant bits of the second quantizer.

18. The method of claim 11, wherein removing measured amplitudes includes subtracting the measured amplitudes of the digital noise signal from the digital equivalent signal.

19. The method of claim 11, further comprising amplifying with logarithmic amplifying circuitry the analog noise signal prior to converting by the first quantizer.

20. The method of claim 11, wherein the first quantizer comprises a step-wise linear quantizer or a non-uniform quantizer having larger quantization errors at its higher most significant bits.

* * * * *